United States Patent [19]

Heinen et al.

[11] Patent Number: 4,744,088
[45] Date of Patent: May 10, 1988

[54] SEMICONDUCTOR LASER ARRAY WITH FOCUSED EMISSION

[75] Inventors: Jochen Heinen, Haar; Christian Hanke, Munich, both of Fed. Rep. of Germany

[73] Assignee: Siemens Aktiengesellschaft, Berlin and Munich, Fed. Rep. of Germany

[21] Appl. No.: 25,579

[22] Filed: Mar. 13, 1987

[30] Foreign Application Priority Data

Mar. 20, 1986 [DE] Fed. Rep. of Germany ....... 3609485

[51] Int. Cl.⁴ .............................................. H01S 3/19
[52] U.S. Cl. ........................................ 372/50; 372/96; 372/45; 372/49
[58] Field of Search ................ 372/96, 49, 50, 108, 372/45, 99, 43

[56] References Cited

U.S. PATENT DOCUMENTS

| 3,806,830 | 4/1974 | Yonezu | 372/45 |
|---|---|---|---|
| 4,217,561 | 8/1980 | Scifres et al. | 372/24 |
| 4,347,612 | 8/1982 | Fekete et al. | 372/50 |
| 4,352,187 | 9/1982 | Amann | 372/46 |
| 4,509,173 | 4/1985 | Umeda et al. | 372/50 |
| 4,594,719 | 6/1986 | Ackley | 372/50 |
| 4,620,307 | 10/1986 | Kappeler | 372/50 |
| 4,641,311 | 2/1987 | Ackley | 372/18 |

FOREIGN PATENT DOCUMENTS

| 0149042 | 11/1984 | European Pat. Off. | 372/50 |
|---|---|---|---|
| 0028382 | 2/1982 | Japan | 372/96 |

OTHER PUBLICATIONS

Publication from Electronics Letters, entitled: "Single-Lobe Symmetric Coupled Lasey Arrays", Electronics Letters, Apr. 11, 1985, vol. 21, No. 8.

J. Katz; "Diffraction Coupled Phase-Locked Semiconductor Laser Array"; Appl. Phys. Lett., 42(7), Apr. 1, 1983.

Primary Examiner—James W. Davie
Assistant Examiner—B. Randolph
Attorney, Agent, or Firm—Hill, Van Santen, Steadman & Simpson

[57] ABSTRACT

A semiconductor laser array having laser active strips optically coupled to one another, wherein only every second laser active strip emits laser energy so that one main emission lobe appears.

12 Claims, 1 Drawing Sheet

SEMICONDUCTOR LASER ARRAY WITH FOCUSED EMISSION

BACKGROUND OF THE INVENTION

1. Field of the Invention

The present invention relates generally to a semiconductor laser array including a sequence of laser active strips disposed adjacent one another.

2. Description of the Related Art

To achieve high intensity laser emissions from a semiconductor laser or laser diode, it is known to arrange semiconductor laser diodes in an array. Such an array is composed of a plurality of laser diodes disposed parallel next to one anther lying in a semiconductor body. Each and every one of the laser diodes is in the form of a laser active strip in the semiconductor body. Given a tightly adjacent arrangement of laser active strips, wave mechanical, or wave optical, coupling of the individual laser active strips relative to one another results so that the individual laser active strips emit mutually coherent radiation. In other words, the total emission output of the laser array is coherent in and of itself.

The neighboring laser active strips of an array exhibit lateral coupling which has a tendency to excite a coupled oscillation mode so that part or all of the neighboring strips oscillate in a phase respectively shifted by 180° relative to one another. The individual laser active strips in fact emit coherent radiation, but this radiation has an opposite phase at the exit location on the end face of the semiconductor diode from one strip to the next. Two emission lobes, thus, derive as a result of the interference and, more or less noticeable subsidiary lobes occur dependent on the number of interfering strips. Such mutual coupling of the strips reduces the usability of such an array to a rather considerable degree.

Semiconductor laser arrays are known from Appl. Phys. Lett., vol. 42 (1983) pages 554–556; U.S. Pat. No. 4,217,561; U.S. Pat. No. 4,509,173; and from Elec. Lett., vol. 21 (1985) pages 347–349.

The aforementioned publications and the U.S. Pat. No. 4,509,173 specify measures with which phase-coupled radiation emissions are achieved in a laser array. To this end, measures are undertaken to provide branching and rejoining of the raditional paths of the generated laser emission in the laser active layer of the semiconductor body. Such arrangements necessarily have nonparallel path portions for guidance of the laser radiation. Technological difficulties arise, particularly for such arrangements which are in the form of MCRW lasers.

A metal clad ridge waveguide laser is disclosed in U.S. Pat. No. 4,352,187, in which mutual energy exchange of laser active strips is recognized.

SUMMARY OF THE INVENTION

An object of the present invention is to provide a semiconductor laser array of a generally standard format having a technologically simple manufacturable structure with parallel laser active strips with which the emission of a single lobe can be reliably achieved.

This and other objects of the invention are achieved in a laser array having a sequence of laser active strips arranged next to one another in a semiconductor body and with every second laser active strip in the sequence of laser active strips being provided with a reflecting means in the region of the end face of the semiconductor body that is intended for emission. The reflecting means can take a variety of forms including mirroring, trenches or grooves formed in the semiconductor body, or a Bragg reflector. When lateral coupling of a plurality of n laser strips forming an array occurs, a plurality of n oscillation modes having a corresponding plurality of n emission characteristics are fundamentally possible. Only the fundamental mode with all laser active strips oscillating with uniform phase has the desired single lobe emission. In general, the oscillation modes have different threshold condition. The mode having the lowest threshold, or combination of modes having similarly low thresholds, will always being to oscillate. When the laser characteristic is traversed from the value of the threshold current toward higher values of current, the mode which is the most favorable operating point can change. In other words, modifications with respect to the emission characteristics occur so that, for example, a laser emission having only a single emission lobe is generally limited to a defined region of current values of the characteristic. Particularly, for a predetermined modulation of the array by modulation of the feed current, this can lead to instabilities or constantly changing oscillation modes.

The present invention is based on the perception that an array composed of more than three laser active strips of the same or similar type and having the same spacing from one another has a tendency to oscillate in the optimal oscillation mode with each laser active strip oscillating offset by a phase of 180° relative to neighboring laser active strips. The condition of having the strips in an array oscillating with a 180° phase shift is fundamentally undesired per se for an array. This is also the most favorable oscillatory condition, particularly up to extremely high operating currents, and is therefore very stable. It is this stability which the present invention exploits with particular advantage.

This per se undesired property for an array is advantageously exploited in the invention such that high stability for the oscillating behavior is guaranteed even when the laser array is greatly modulated. Various measures provided by the present invention insure that only every second laser active strip of the sequence of laser active strips that are arranged side-by-side can emit laser energy and, therefore, the strips lying therebetween are accordingly prevented from emitting. However, the laser active strips which do not emit nonetheless oscillate in the provided mode of the laser array. Preventing the emission from the respective adjacent laser active strips in accordance with the invention is achieved by providing a highly reflective region at the respective strip ends in the region of the end face of the semiconductor body from which the emission emanates. In accordance with the first embodiment, the highly reflective region includes either metallic or dielectric (interference) mirrors. In a further embodiment, the invention provides Bragg reflectors or Bragg gratings, as are used in laser diode technology.

The end face of the semiconductor body which lies opposite the emission side of the semiconductor body for the laser array at which no emissions are desired is provided with an overall high grade reflective mirroring.

The individual laser active strips in an array according to the present invention exhibit coupling due to an overlap in the optical or electromagnetic field distributions of the field of neighboring strips. In other words, the laser active strips have a mutual energy exchange.

This effect is known per se in oxide strip lasers, MCRW (metal clad ridge waveguide) lasers, IRW (integrated ridge waveguide) lasers, CSP (channeled substrate planar) lasers, and the like. See for example, U.S. Pat. No. 4,352,187.

A laser array of the invention may not be composed only of laser active strips of a single type of semiconductor laser. Indeed, the type of semiconductor laser can change over the length of the respective laser active strip. For example, it is advantageous in view of the fact that, for example, an oxide strip laser has a pronounced great lateral coupling with neighboring laser active strips given a relatively large spacing of the laser active strips from one another, at least in comparison with the MCRW laser. An MCRW laser, by contrast, is distinguished by a particularly high index guidance and favorable curvature of the phase front of the light conducted in the laser active strip. In comparison to the oxide strip laser, an MCRW laser has a more advantageous emission characteristic for a laser array. It is, thus, advantageous in one embodiment to utilize both an MCRW laser and an oxide strip laser in a single array, and even along a single laser strip.

DESCRIPTION OF THE PREFERRED EMBODIMENTS

Figure 1:
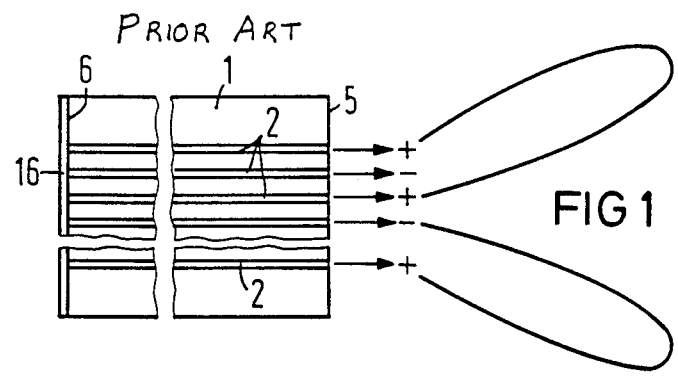
FIG. 1 is a plan view of a known semiconductor laser array having parallel laser active strips in a semiconductor body.

In FIG. 1, a known semiconductor laser array is formed on a semiconductor body 1 having a plurality of parallel laser active strips 2 adjacent one another. The emissions of adjacent ones of the laser active strips 2 exhibit respective positive and negative interference so that a plurality of lobes of the laser emission results at the emitting face 5 of the semiconductor body 1.

Figure 2:
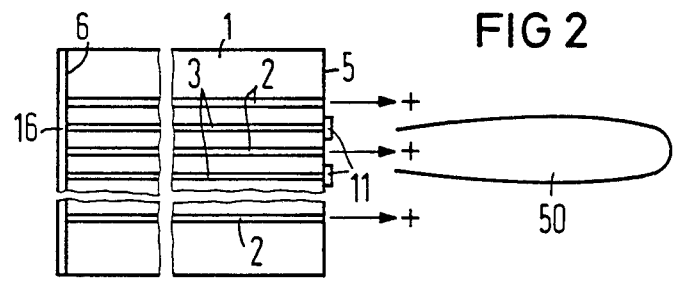
FIG. 2 is a plan view of a semiconductor laser array according to the principles of the present invention.

In the laser array of the present invention shown in FIG. 2, the semiconductor body 1 includes the laser active strips 2 for emitting a laser emission. The intended emission 50 of the laser emission generated by the laser active strips 2 ensues at the right-hand end face 5 of the semiconductor body 1. The laser array in FIG. 2 includes further laser active strips 3 which, in accordance with the present invention, do not emit any laser emission at the end face 5.

In the exemplary embodiment of FIG. 2, mirror surfaces 11 are provided in the region of the laser active strips 3 at the end face 5 to prevent emissions therefrom. The mirror surfaces 11, for example, are metal coating which can be formed of silver having an underlying transparent layer; of $Al_2O_3$; or of a dielectric mirror, or interference mirror, composed of a layer sequence.

Figure 3:
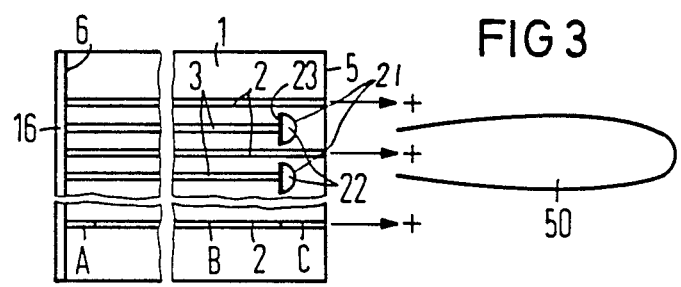
FIG. 3 is a plan view of a second embodiment of a semiconductor laser array.

In FIG. 3, reflector arrangements 21 are provided to reflect the emission of the laser active strips 3, the reflector arrangements 21 being inserted into the material of the semiconductor body 1. European Patent Application No. 0,149,042, incorporated herein by reference, discloses a similar reflector arrangement. In particular, the reflector arrangements 21 include trenches 22 etched into the material of the semiconductor body 1 so that an end face 23 of the trench 22 faces the end of the laser active strip 3 and forms a planar surface, which has a reflecting effect on the emission of the laser strip 3. The surface 23 of the trench 22 can even be mirrored.

Figure 4:
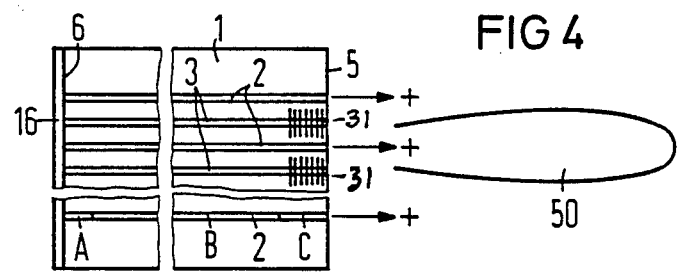
FIG. 4 is a plan view of yet another embodiment of the present semiconductor laser array.

In another embodiment as shown in FIG. 4, a Bragg reflector (DBR) 31 is provided at the right hand end of the respective laser active strips 3, such Bragg reflectors being known from laser diode technology.

In the embodiments of FIGS. 2, 3, and 4, the left-hand end face 6 of the semiconductor body has a reflective effect over its entire surface, such as being provided with a mirror 16.

Referring again to FIG. 3, different lateral structures A, B, and C are provided distributed along the length of a laser active strip 2, being illustrated therein as the lowermost laser active strip 2 for purposes of simplicity. For example, it is beneficial to provide a type of MCRW (metal clad ridge waveguide) laser for the lateral structure C, which has particular advantages in the index guidance of the laser emission. As used herein, the term "lateral structure" is defined as a longitudinally extending structure along the laser active strips. The MCRW laser of structure C however exhibits less pronounced lateral coupling. Lateral coupling would have no effect anyway in the region of the structure C, since as shown in FIG. 3, the laser active strips 3 do not extend into the region of the lateral structure C of the strips 2, or at least do not extend significantly into this region.

It is a further advantage to form the lateral structures B as an oxide strip laser which typically has a pronounced lateral coupling into the neighboring laser active strips 3. The lateral structure A, for example, can again be an MCRW structure in consideration of the reflection at the end face 6.

The technology for manufacturing the semiconductor laser array of the present invention and the resulting structure is simple and relatively uninvolved in comparison to semiconductor laser arrays which have less favorable properties, such as the one shown in FIG. 1.

It is true that for the fully mirrored, laser active strips 3, only part of the laser emission energy is the resonator is in dynamic equilibrium. A considerably part of the generated optical emission power is coupled out through the neighboring laser active strips 2 which are in interactive coupling with the laser active strips 3.

The semiconductor laser arrays of the present invention are formed in semiconductor material as is usually employed for semiconductor lasers. Preferred semiconductor materials include gallium aluminum arsenide, indium gallium arsenide phosphide, indium gallium aluminum arsenide, indium gallium aluminum phosphide, and gallium aluminum antimonide, as well as others.

Although other modifications and changes may be suggested by those skilled in the art, it is the intention of the inventors to embody within the patent warranted hereon all changes and modifications as reasonably and properly come within the scope of their contribution to the art.

We claim as our invention:

1. An improved semiconductor laser array in a semiconductor body, the improvement comprising:
    a sequence of laser active strips for generating laser emissions disposed next to one another;
    means provided at every second one of said laser active strips in said sequence of laser active strips for preventing emission of the laser radiation by reflection, said emission preventing means being provided in the region of an end face of said semiconductor body so that the laser emission from said laser array is only a single emission lobe from said end face of said semiconductor body.

2. A semiconductor laser array as claimed in claim 1, wherein said reflecting means for preventing laser emission is a mirroring at said end face of said semiconductor body in the region of said second ones of said laser active strips.

3. A semiconductor laser array as claimed in claim 1, wherein said reflecting means for preventing emission is a reflecting surface spaced from said end face of said semiconductor body and formed extending into a material of said semiconductor body in the region of said second ones of said laser active strips.

4. A semiconductor laser array as claimed in claim 3, wherein said reflecting surface is a sidewall of a trench formed in said semiconductor body.

5. A semiconductor laser array as claimed in claim 1, wherein said reflecting means is a Bragg reflector for said second ones of said laser active strips.

6. An improved semiconductor laser array formed in a semiconductor body, the improvement comprising:
alternate first and second laser active strips disposed parallel and adjacent one another for mutual optical coupling, said first laser active strips emitting a laser radiation from an end face of said semiconductor body, means for preventing said second laser active strips from emitting laser radiation from said end face of said semiconductor body.

7. A semiconductor laser array as claimed in claim 6, further comprising:
means for reflecting laser radiation provided adjacent said end face of said semiconductor body at each of said second laser active strips.

8. A semiconductor laser array as claimed in claim 7, wherein said reflecting means at each of said second laser active strips is a mirror.

9. A semiconductor laser array as claimed in claim 7, wherein said reflecting means is a distributed reflector applied to each of said second laser active strips.

10. A semiconductor laser array as claimed in claim 6, wherein at least one of said first laser active strips is of at least two different structures along its length.

11. A semiconductor laser array as claimed in claim 10, wherein said at least one first laser active strip is an oxide strip laser for a first part of its length and is a metal clad ridge waveguide for at least a second part of its length.

12. A semiconductor laser array as claimed in claim 10, wherein each of said first laser active strips is of at least two different structures along their respective lengths.

* * * * *